(12) United States Patent
Miles et al.

(10) Patent No.: US 11,266,023 B2
(45) Date of Patent: Mar. 1, 2022

(54) ELECTRONIC CIRCUIT PRODUCTION (71) Applicant: DST Innovations Limited, Bridgend (GB)

(72) Inventors: Anthony Miles, Bridgend (GB); Robert Miles, Bridgend (GB)

(73) Assignee: DST Innovations Limited, Bridgend (GB)

( * ) Notice: Subject to any disclaimer, the term of this patent is extended or adjusted under 35 U.S.C. 154(b) by 98 days.

(21) Appl. No.: 16/384,327

(22) Filed: Apr. 15, 2019

(65) Prior Publication Data

US 2019/0246503 A1 Aug. 8, 2019

Related U.S. Application Data

(62) Division of application No. 15/023,307, filed as application No. PCT/GB2014/052865 on Sep. 19, 2014, now abandoned.

(30) Foreign Application Priority Data

Sep. 19, 2013 (GB) .................................. 1316652

(51) Int. Cl.
*C25D 7/06* (2006.01)
*C25F 3/02* (2006.01)
(Continued)

(52) U.S. Cl.
CPC ................ *H05K 3/07* (2013.01); *C25D 5/34* (2013.01); *C25D 7/00* (2013.01); *C25D 7/0628* (2013.01); *C25D 17/00* (2013.01); *C25F 3/02* (2013.01); *C25F 7/00* (2013.01); *H01L 21/3063* (2013.01); *H05K 3/068* (2013.01); *C25D 7/0657* (2013.01); *C25D 9/08* (2013.01)

(58) Field of Classification Search
None
See application file for complete search history.

(56) References Cited

U.S. PATENT DOCUMENTS 3,582,479 A 6/1971 Urban et al.
4,050,996 A 9/1977 Klingenmaier
(Continued)

FOREIGN PATENT DOCUMENTS

DE 10 2005 031948 B3 6/2006
GB 1 390 709 A 4/1975
(Continued)

OTHER PUBLICATIONS

International Search Report of the International Searching Authority dated Feb. 24, 2015, issued in connection with International Application No. PCT/GB2014/052865 (2 pages).
(Continued)

*Primary Examiner* — Brian W Cohen
(74) *Attorney, Agent, or Firm* — McCarter & English, LLP (57) ABSTRACT

Electrolytic Etching/Deposition System. A system for continuous circuit fabrication comprising means for storing and dispensing the substrate, means for laminating the substrate, means for printing the substrate, means for optical inspection of the substrate, means for photolithography of the substrate, means for drying the substrate, means for developing the substrate, means for washing the substrate and means for electroplating the substrate.

12 Claims, 8 Drawing Sheets

(51) Int. Cl.
*C25F 7/00* (2006.01)
*C25D 3/34* (2006.01)
*H05K 3/07* (2006.01)
*C25D 5/34* (2006.01)
*C25D 7/00* (2006.01)
*C25D 17/00* (2006.01)
*H01L 21/3063* (2006.01)
*H05K 3/06* (2006.01)
*C25D 9/08* (2006.01)

(56) References Cited

U.S. PATENT DOCUMENTS

| | | | |
|---|---|---|---|
| 4,426,266 A | 1/1984 | Ukena et al. | |
| 4,501,647 A | 2/1985 | Korpi et al. | |
| 4,507,190 A | 3/1985 | Brendlinger et al. | |
| 4,772,371 A | 9/1988 | Lace et al. | |
| 5,425,862 A | 6/1995 | Hartmann et al. | |
| 6,217,787 B1* | 4/2001 | Haller | C25F 3/02 205/640 |
| 6,695,957 B1 | 2/2004 | Stockbower et al. | |
| 2004/0259365 A1 | 12/2004 | Komai et al. | |
| 2006/0027460 A1 | 2/2006 | Chang et al. | |
| 2006/0201814 A1* | 9/2006 | Hafezi | C25D 17/10 205/102 |
| 2008/0096044 A1 | 4/2008 | Matsumoto | |
| 2009/0032404 A1 | 2/2009 | Tachi et al. | |
| 2009/0166189 A1 | 7/2009 | Saitou | |
| 2011/0147221 A1 | 6/2011 | Nishiwaki | |
| 2011/0186423 A1 | 8/2011 | Cheng | |
| 2012/0305892 A1 | 12/2012 | Thornton et al. | |

FOREIGN PATENT DOCUMENTS

| | | |
|---|---|---|
| GB | 2 072 704 A | 10/1981 |
| JP | H01-291992 A | 11/1989 |
| JP | H04-268084 A | 9/1992 |
| JP | 2004-131842 A | 4/2004 |
| JP | 2005-166977 A | 6/2005 |
| JP | 2011-021233 A | 2/2011 |

OTHER PUBLICATIONS

International Preliminary Report on Patentability dated Mar. 22, 2016, issued in connection with International Application No. PCT/GB2014/052865 (7 pages).
European Office Action dated Aug. 10, 2018, issued in connection with European Application No. 14787014.1 (5 pages).
Office Action (Restriction Requirement) dated Feb. 1, 2018, issued in connection with U.S. Appl. No. 15/023,307 (7 pages).
Office Action dated Jul. 6, 2018, issued in connection with U.S. Appl. No. 15/023,307 (17 pages).
Office Action dated Jan. 15, 2019, issued in connection with U.S. Appl. No. 15/023,307 (16 pages).
Combined Search and Examination Report dated Oct. 24, 2013, issued by the UK Intellectual Property Office in connection with Application No. GB1316652.5 (8 pages).
Search Report dated Nov. 11, 2013, issued by the UK Intellectual Property Office in connection with Application No. GB1316652.5 (3 pages).
Examination Report dated Aug. 4, 2016, issued by the UK Intellectual Property Office in connection with Application No. GB1316652.5 (3 pages).
Examination Report dated Jan. 12, 2017, issued by the UK Intellectual Property Office in connection with Application No. GB1316652.5 (2 pages).
European Office Action dated Jul. 16, 2021, issued in connection with European Patent Application No. 14787014.1 (5 pages).

\* cited by examiner

ELECTRONIC CIRCUIT PRODUCTION

RELATED APPLICATIONS

This application is a divisional of U.S. patent application Ser. No. 15/023,307 filed on Mar. 18, 2016, which is the 35 U.S.C. § 371 U.S. National Phase of International Application No. PCT/GB2014/052865 filed on Sep. 19, 2014, which claims the benefit of United Kingdom (Great Britain) Patent Application No. 1316652.5 filed on Sep. 19, 2013. The entire disclosures of the foregoing applications are incorporated by reference herein.

FIELD OF THE INVENTION

The present invention relates to the fabrication of electronic circuits and/or semiconductors on flexible substrates.

BACKGROUND OF THE INVENTION

As is known in the art, fabrication of circuitry usually involves the stages of deposition, removal, patterning and modification of electrical properties. This process has been streamlined with the introduction of reel-to-reel production for flexible substrates. Further to this, reel-to-reel fabrication processes are known in which an element of the process uses electrolysis, specifically electroplating of the conductive layers of substrates.

US 2012/0305892 is concerned with an electronic device comprising an in-plane component formed in an organic semiconductor layer, desirably graphene, on a flexible substrate, wherein the component is formed using imprint lithography to create a trench through the organic semiconductor layer in a roll-to-roll process, wherein the number of process steps required is limited to allow manufacture of the device in a single integrated apparatus.

US 2004/0259365 is concerned with providing a polishing method and a polishing apparatus for appropriately controlling the potential of an acting electrode to perform an accurate and stable electrolytic polishing process; there is also provided a method of manufacturing a semiconductor device using the polishing method and the polishing apparatus.

In the past, using electrolysis in the fabrication of electronic circuits and/or semiconductors has been difficult to practically achieve. Specifically, it has been difficult to achieve a system design where an electrical voltage is applied to the conductive elements of the substrate. Further, in systems where the desired connection has been achieved, it has previously been at the expense of the speed and thereby efficiency of the continuous processing of the system, for instance requiring a separate stage in the fabrication process, where no other processing is able to be undertaken, wherein the substrate is held stationary and an electrode is steadily moved towards the substrate, thereby applying a voltage to the substrate.

As such, it would be beneficial in the field if a system design were envisaged in which the application of the voltage to the substrate, that is turning the substrate into an electrode, were seamlessly integrated into the fabrication process in a manner that required no extra stages and no further time delay when added to the usual operation processes of the fabrication system. Stated another way, a system of such a design would represent a saving of time, and thereby an increase in efficiency, over current fabrication processes that include an electrolysis stage.

Manufacturers are ever more concerned with the impact that their processes may be having on the environment around them. However, it is crucial that such concerns can be addressed within the context of profitable business. As such, innovations that can simultaneously decrease the adverse effects on the environment, whilst also increasing efficiency, represent vital contributions to the field.

STATEMENT OF THE INVENTION

The aspects of the present invention are defined by the accompanying claims.

According to one embodiment of the present invention, there is provided a means for the fabrication of flexible conductive circuitry within a reel-to-reel production process.

BRIEF DESCRIPTION OF THE DRAWINGS

There now follows, by way of example only, a detailed description of preferred embodiments of the present invention, with reference to the figures identified below.

DETAILED DESCRIPTION OF THE EMBODIMENTS

In the following description, functionally similar parts carry the same reference numerals between figures.

The present invention comprises a system for the production of electronic circuits or semiconductors onto flexible substrates. In particular, the system is an inline system, known in the art as reel-to-reel, whereby the process of fabrication can be said to be continuous.

Figure 1:
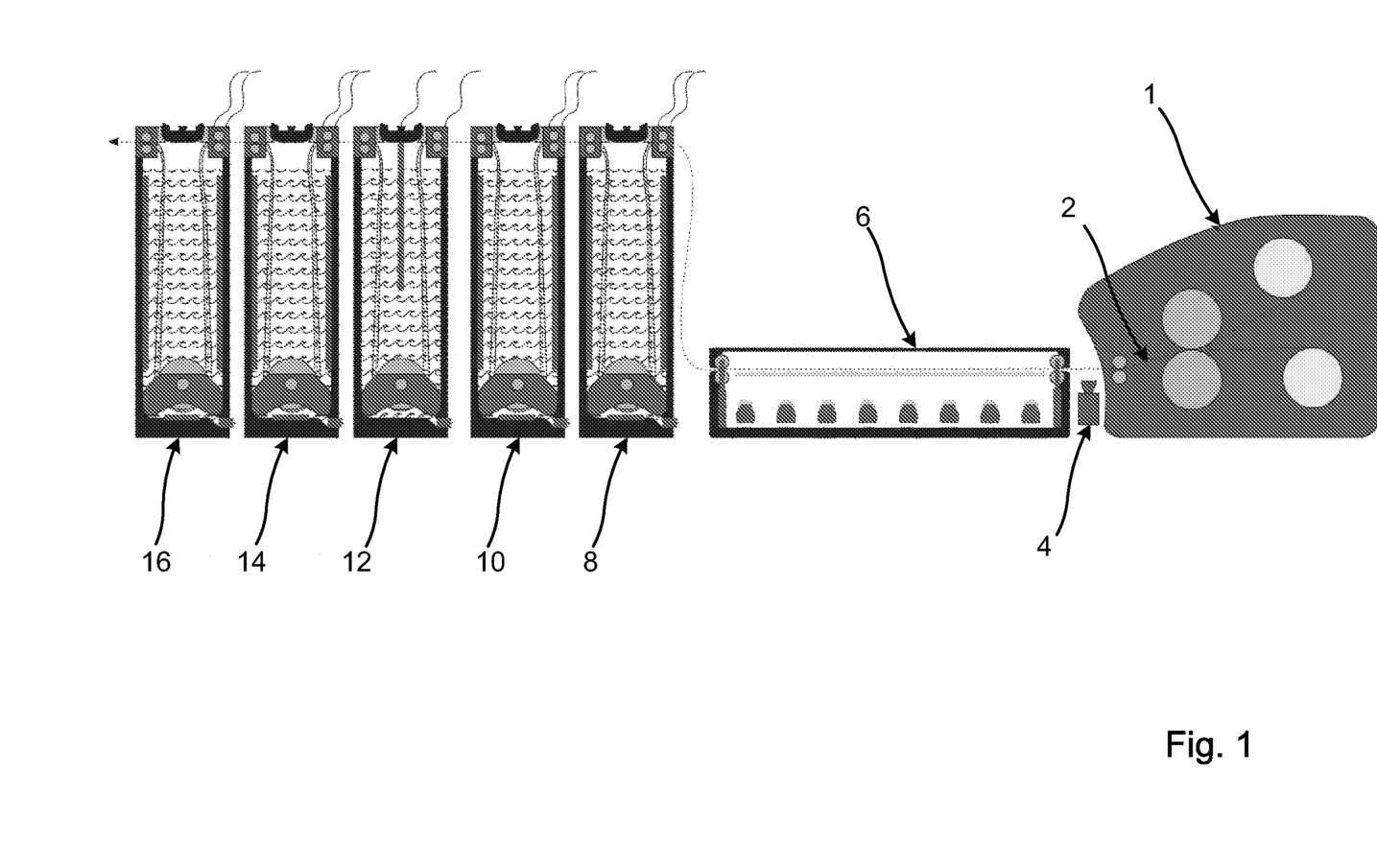
FIG. 1 is a schematic cross-section of the apparatus in operation.

FIG. 1 illustrates a cross-section of the apparatus in operation. The system has a laminator unit 1 that forms a substrate 2. The substrate 2 exits the laminator unit 1 and is transported towards the photolithography unit 6, and in doing so passes an optical inspection unit 4. The substrate 2 is then transported to the photoresist development unit 8, before being further transported to the post-development wash unit 10. Following this, the substrate 2 is transported to the conductive-layer etch unit 12, and subsequently the post-etch wash unit 14. Finally, the substrate 2 is transported to the photoresist removal unit 16, after which the substrate has been successfully fabricated in preparation for the addition of electronic devices or constructs. The operation of the individual units of the system will be further described below.

As an illustrative example, the conductor-coated substrate described herein is most frequently referred to as ITO coated PET, however those skilled in the art will appreciate that this material could be any transparent or non-transparent material such as one or more of ITO, ATO, gold, silver graphite, copper, graphene, zinc oxide, aluminium oxide, lead zirconium titanate, barium titanate and any other appropriate coating that can be deposited on the substrate in a thin layer. The material may be provided in one or more continuous or semi-continuous conductive coating or layer, and may comprise a plurality of such layers of the same or different materials, such as the materials mentioned above. Similarly, the substrate can be any material that can be coated with a thin layer of conductive material, and in some cases the conductive material itself may also act as the substrate.

Figure 2:
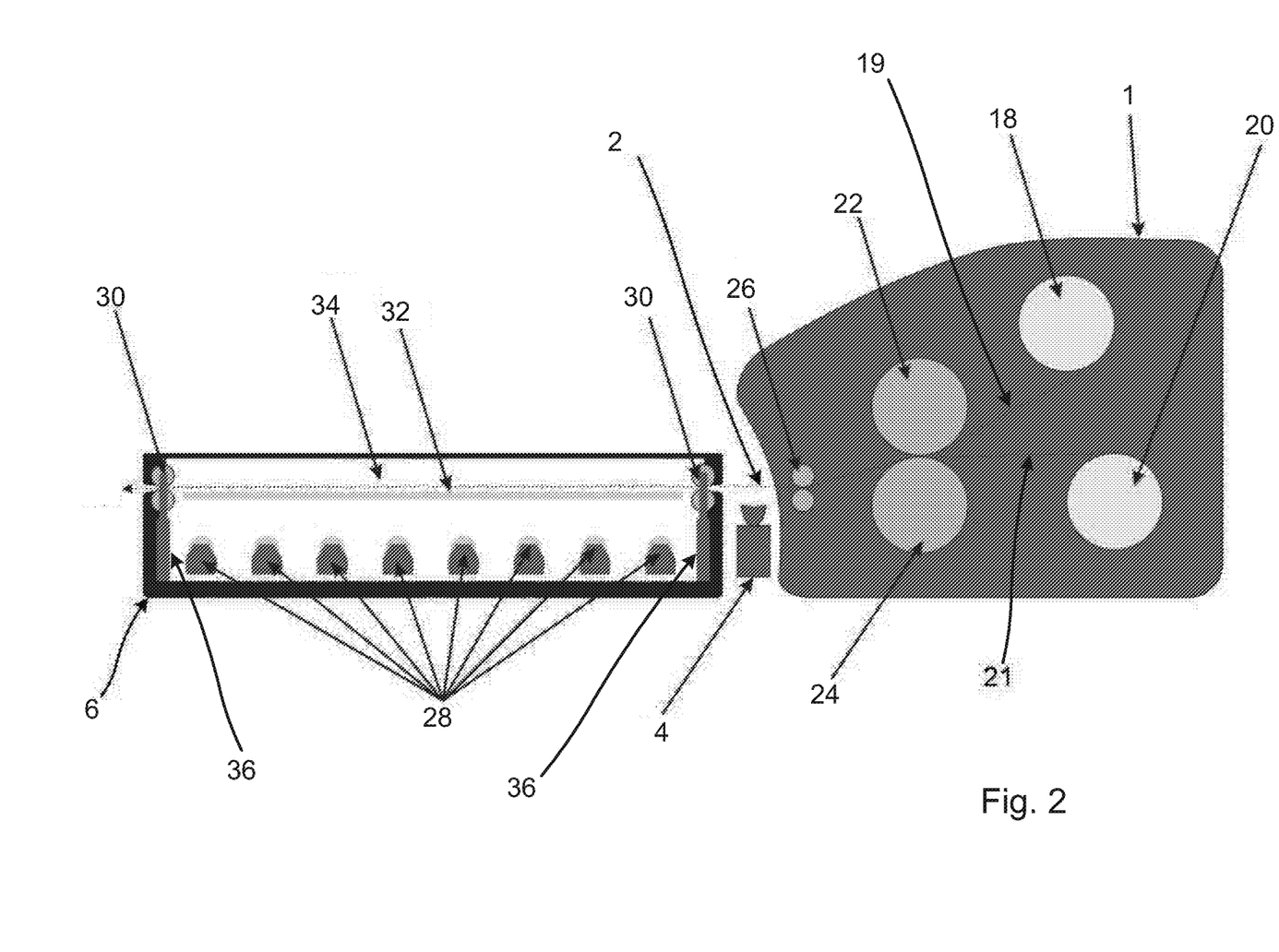
FIG. 2 is a schematic cross-section of the laminator unit, optical inspection unit and photolithography unit.

FIG. 2 illustrates a cross-section of the laminator unit 1, optical inspection unit 4 and photolithography unit 6. The laminator 1 has a substrate feed roller 18, which inputs the substrate base layer 19 into the system. Similarly, the dry etch resist feed roller 20 inputs the dry etch resist layer 21 into the system. The pressure and traction roller 22 operates in conjunction with the heated pressure roller 24 to output the substrate 2 to the alignment rollers 26 at the exit of the laminator unit 1.

The photolithography unit 6 has variable height rollers 30, supported by variable height roller support arms 36, positioned at its entrance and exit. Within the photolithography unit 6 is a pattern design 32, which is illuminated by an array of Ultra Violet (U.V.) light sources 28.

In operation, the laminator unit 1 is designed to physically combine the constituent materials of a flexible substrate. This is achieved in a uniform manner through the application of heat and pressure. To avoid contamination by external elements, the laminator unit 1 is both light-sealed and dust-sealed, thereby protecting the light-sensitive materials contained within. The laminator unit 1 is designed to accommodate separate rolls for each of the constituent materials of a flexible substrate within it. For instance, the material that is to be used as the substrate base layer 19 would be fitted as a roll onto the substrate base feed roller 18. Similarly, the material to be used as the dry etch resist layer 21 would be fitted as a roll onto the dry etch resist feed roller 20. The material that is to be used as the substrate base layer 19 may be coated with a transparent conductive material or materials such as mentioned above. However, as will be appreciated by those skilled in the art, the coating of the substrate base layer 19 does not have to be transparent, and the substrate itself can be any material that can be dispensed from as roll. Further, in some cases, the conductive material may itself form the substrate base layer 19. When activated, the laminator unit 1 would act to simultaneously unwind the substrate base feed roller 18 and the dry etch resist feed roller 20, at a synchronized speed, ensuring that the rolls remain both wrinkle and air-bubble free. This action would feed both the substrate base layer 19 and the dry etch resist layer 21 towards the pressure and traction roller 22 and the heated pressure roller 24. The substrate base layer 19 and the dry etch resist layer 21 intersect at a point directly between the pressure and traction roller 22 and the heated pressure roller 24. At this intersection, the pressure and traction roller 22 applies a lateral force from its surface into the substrate 2 along a plane perpendicular to the surface of the substrate 2. Simultaneously, the heated pressure roller 24 applies both heat, and a lateral force from its surface into the substrate 2 along a plane parallel, but oppositely directed, to the force applied by the pressure and traction roller 22. In this manner, the simultaneous action of the heat and pressure application acts to physically combine the substrate base layer 19 and the dry etch resist layer 21 into a single flexible substrate 2, suitable for undergoing etching for the purpose of electronic circuit and/or semiconductor fabrication. Following this, the laminator unit 1 outputs the newly formed substrate 2 through the alignment rollers 26, which are able to move along the vertical axis, and thereby act to correctly orientate the substrate 2 for the optical inspection process.

The substrate 2 is outputted from the laminator unit 1 towards the photolithography unit 6 along a path 34. Before entering the photolithography unit 6, the substrate 2 is subjected to an inspection for defects by an optical inspection unit 4. For instance, the optical inspection unit 4 could comprise a camera system connected to a processor that is configured to inspect the substrate 2 for visible defects following the lamination process of the laminator unit 1. Typical defects of interest include, but are not limited to, bubbles, wrinkles, creases, rips and overlaps, as well as any other marks that could affect the exposure process. In the event that a defect is located by the optical inspection unit 4, the processor system will notify the operator and the substrate 2 will be moved past the area of defect, thus ensuring only substrate that is not defected will continue to be processed by the setup as disclosed. This has the advantageous effect of efficiently implementing resources, where no further processing in the production line is wasted on defective elements of the substrate, thereby saving electrical power, time and chemical resources.

Following optical inspection, the substrate 2 will be transported along substrate path 34 into the photolithography unit 6 by the rotation of the adjustable height rollers 30, which also serve to maintain a constant tension across the substrate 2. The substrate 2 will follow substrate path 34 until it is correctly positioned over the pattern design 32, which is fixed in location within the photolithography unit 6. Once in location above the pattern design 32, the adjustable height roller support arms 36 will retract downwards, moving the adjustable height rollers 30 similarly downward, thereby pulling the substrate 2 into contact with the pattern design 32. The pattern design 32 is a pattern formed by the relative positioning of areas that are opaque, to areas that are transparent, and is arranged to form the design of the desired final circuitry. With the substrate 2 now in contact with the pattern design 32, the U.V. light source array 28 is automatically activated for a certain predetermined period of time, thereby illuminating the areas of the photoresist layer of the substrate that are left exposed by the transparent areas of the pattern design 32. By chemical processes known in the art, the areas of the photoresist layer of the substrate 2 that are illuminated by the U.V. light source array 28 will undergo chemical changes in their material properties, leaving these areas markedly altered in comparison with the areas of the photoresist layer which were unexposed to the U.V. light. After the illumination is completed and the pattern has been transferred, the adjustable height roller support arms 36 will extend upwards, in turn moving the adjustable height rollers 30, thereby taking the substrate 2 and the pattern design 32 out of contact. Following this, the adjustable height rollers 30 will rotate so as to transport the substrate 2 out of the photolithography unit 6 along substrate path 34.

The process as described above has been described within the context of a specific example, namely that of positive photolithography. However, as will also be appreciated by those skilled in the art, the apparatus disclosed in FIG. 2 could equally be used with, for instance, negative photolithography, or other types of photolithography not herein described.

Figure 3:
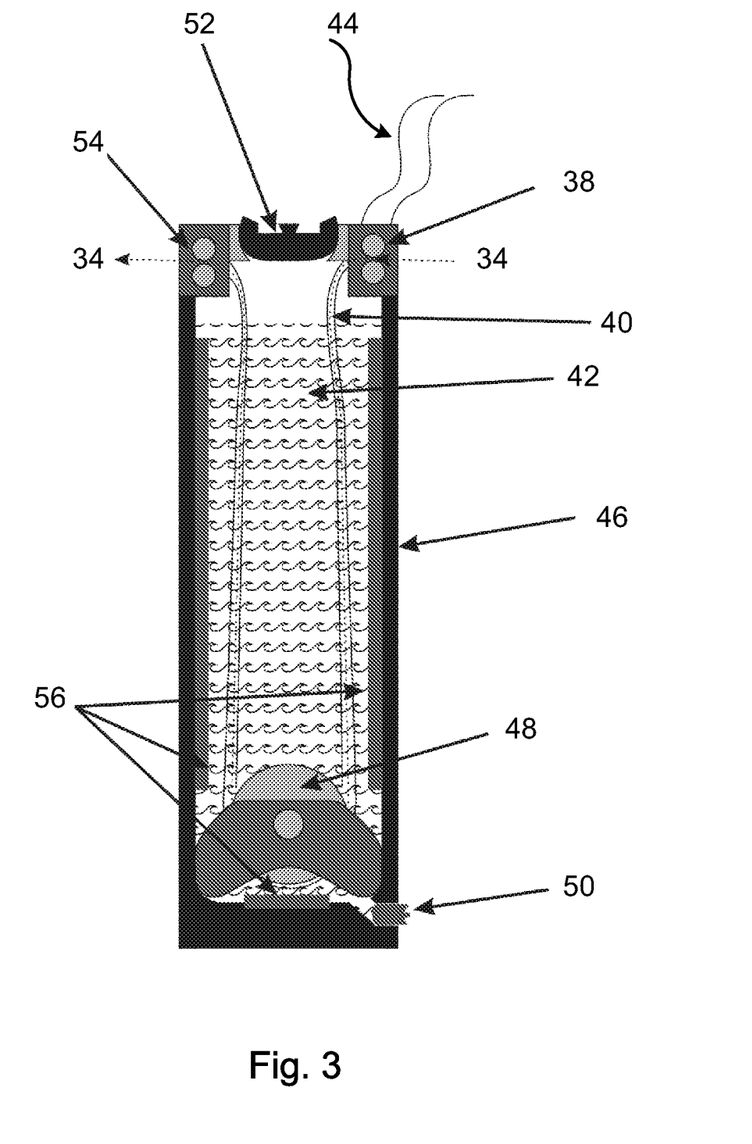
FIG. 3 is a schematic cross-section of any one of the photoresist development unit, the post-development wash unit, the post-etch wash unit or the photoresist removal unit.

FIG. 3 is an illustrative cross-section of any one of the photoresist development unit 8, the post-development wash unit 10, the post-etch wash unit 14 or the photoresist removal unit 16. Whilst the function of each of these units within the fabrication process is different, the design of the apparatus required to perform these functions is substantially the same, with only the chemical composition of the fluid 42 and the varying methods of operation being different. In order to function effectively, each tank 46 is both electrochemical and solvent resistive, and is preferably, but not essentially, transparent for the purpose of inspection. Within each tank 46 there is contained a fluid 42, through which the substrate 2 travels along the substrate guide 40. To effect this movement, there are current carrying traction feed rollers 38 placed at the entrance of each tank 46, which are connected to an electrical power source (not shown) by electrical connectors 44, and traction feed rollers 54 placed at the exit of each tank 46, wherein the current carrying traction feed rollers 38 are used to ensure that an electrical current is always present in the substrate 2. As the fabrication process herein described comprises a plurality of the tank units shown in FIG. 3, each unit in the system is in electrical contact by virtue of the substrate 2. Hence, as certain tank units, namely the conductive-layer etch unit 12 of FIG. 4, involve the application of voltages in their operation, it is thereby necessary to apply voltages to the remaining tank units in the system to directly oppose and thereby neutralize the voltages that may leak from the conductive-layer etch unit 12 into units of the system that do not require electrical current in their operation. This is the purpose of the current carrying traction feed rollers 38. The tank 46 also has a cap 52 for refilling the fluid 42, and a drain plug 50 for draining the fluid 42 from the tank 46. Also within the tank 46 is a substrate guide roller 48, and an aeration system 56 placed on each interior wall of the tank 46. In an alternative embodiment, the tank 46 may contain a plurality of substrate guide rollers 48, of substantially similar structure but varying size, which would enable the processing of longer sections of substrate 2. In a further alternative, the traction feed roller 54 may be electrically connected, for example to collect digital reference information used to reference the location of the substrate 2 within the process.

In operation, the photoresist development unit 8 transports the substrate 2 into the entrance of the unit through the rotation of the current carrying traction feed rollers 38. The electrical connectors 44 provide an electrical voltage to the current carrying traction feed rollers 38, which serves to oppose and neutralise any voltages that may propagate along the substrate 2 from other units in the system. On entering the tank 46, the substrate 2 further enters a substrate guide 40. The substrate guide 40 can be imagined to be physically and functionally similar to the guide tracks that a sliding door moves along, as the substrate guide 40 merely brackets the sides of the substrate, leaving the top surface and bottom surface exposed to the fluid 42. As can be seen in FIG. 3, the substrate guide 40 traverses the full length of the tank, taking the substrate 2 through a large volume of the fluid 42. The substrate 2 is pulled through the fluid 42 through the rotational traction of the substrate guide roller 48 until such time as the current carrying traction feed roller 38 comes into contact with a conductive area of the substrate 2 where there is no photoresist present, at which point the system sensors (not shown) detect that the substrate 2 is in the correct position, and the transportation of the substrate 2 is stopped.

As this is the photoresist development unit 8, the fluid 42 in this case is a fluid suitable for developing the photoresist layer that was subjected to UV light exposure in the photolithography unit 6, and will be known by those skilled in the art. By virtue of the chemical change that the areas of the substrate 2 that were exposed to UV light in the photolithography unit 6 underwent, the developing fluid acts to chemically dissolve the photoresist layer of these areas, creating a suspension of the dissolved material in the fluid 42. This process of development is aided by the introduction of air bubbles into the tank 46 from the aeration system 56, which in acting like a physical stirrer serves to agitate the fluid sufficiently to increase the molecular reaction rate of the developing fluid on the photoresist layer of the substrate 2. This process leaves the top layer of the substrate 2 only bearing the photoresist layer that was intended by the design. After the substrate 2 has moved through the tank 46, the traction feed rollers 54 transport the substrate through the exit of the photoresist development unit 8 along path 34. Following the use of the photoresist development unit 8, when the setup is no longer in use, it is possible to drain the fluid 42 from the tank 46 by means of the drain plug 50. This leads to the advantageous effect of being able to reclaim the material that formerly comprised the photoresist layer of the substrate 2 that was dissolved by the fluid 42 during the development process. In this way the design can be seen to reduce the cost of materials in the process, and can thereby also be considered to be environmentally friendly. Before operation is intended to begin again, the fluid can be refilled through cap 52. This embodiment could be used in processes where any other element of the substrate were to be removed (as opposed to just those which were exposed to UV light), requiring only that in such instances a photoresist appropriate for such a process has been used.

In operation, the post-development wash unit 10 is substantially similar to the photoresist development unit 8 described above. In a fashion similar to that described above, the substrate 2 having been processed by the photoresist development unit 8 then enters the post-development wash unit 10, and is transported through the fluid 42. In the case of the post-development wash unit 10, the fluid 42 contained within is a fluid suitable for the cleaning of the substrate 2, removing and neutralising any traces of developing fluid that may have remained on the substrate 2 following the operation of the photoresist development unit 8. Further, the action of the cleaning fluid also removes any further remnants of the photoresist layer that were intended to be removed in the photoresist development unit 8. In a similar manner to that of the photoresist development unit 8, the fluid can be drained through drain plug 50, and any materials in suspension can be reclaimed for reuse.

Figure 4:
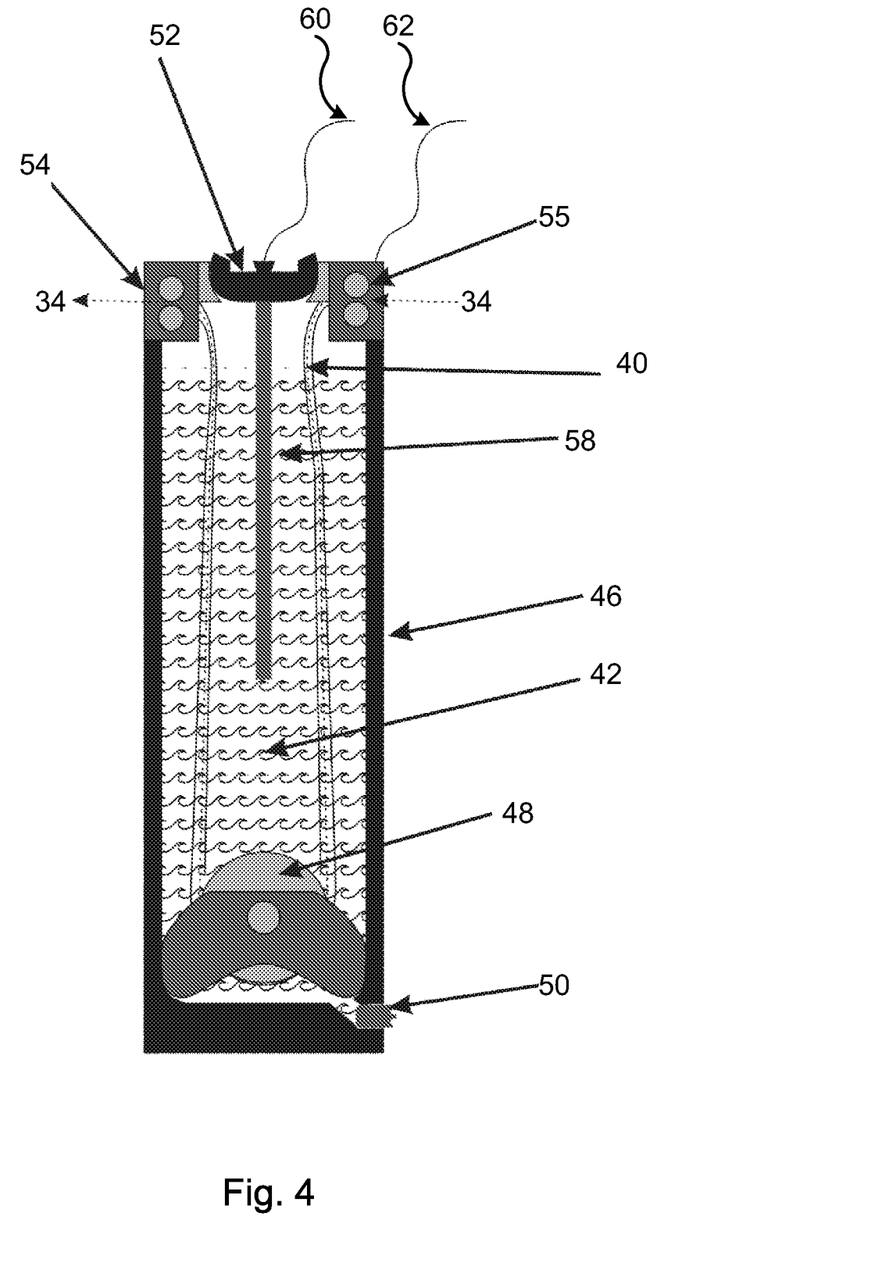
FIG. 4 is a schematic cross-section of the conductive-layer etch unit.

FIG. 4 is a schematic cross-section of the conductive-layer etch unit 12. The design of the conductive-layer etch unit 12 is similar to the design of the tank of FIG. 3; however there are some essential features of distinction. The underlying feature that drives this distinction is that the conductive-layer etch unit 12 is designed to exploit the phenomenon of electrolysis. In line with this operation, an electrode 58 is attached to the cap 52, which projects downwards and into the fluid 42. This electrode is provided with a DC electrical voltage of a particular polarity by the electrical connector 60. The electrode of opposite polarity is physically separated from the first electrode 58, and is here advantageously incorporated into the functionality of the electrically polarized traction feed roller 55. The electrically polarized traction feed roller 55 is provided with a DC voltage of a polarity opposite to the electrode 58, by means of the electrical connector 62. In comparison with the setup of FIG. 3, the other distinction to be made is the lack of aeration system 56. These important differences aside, the form of the tanks are substantially similar.

In operation, the conductive-layer etch unit 12 of FIG. 4 pulls the substrate along path 34 and into the tank 46 by means of the electrically polarized traction feed rollers 55. Following the processes of the previous stages, the substrate 2 arrives at the electrically polarized traction feed rollers 55 with select areas of the conductive layer exposed. As such, when the substrate 2 comes into contact with the electrically polarized traction feed rollers 55, the electrical voltage as supplied by electrical connector 60 imparts a current of the same polarity into the conductive layer of the substrate 2. The substrate 2 then proceeds towards the fluid 42 by means of the rotation of the substrate guide roller 48. The tank 46 contains an electrolyte that is known in the art. As would be appreciated by the person skilled in the art, this fluid should also be suitable for use with the conductive compound to be removed from the substrate 2, as would be appropriate for an electrolytic process. The substrate 2 is brought into the fluid 42, whereby the process of electrolysis begins due to the electrical current flowing into the fluid 42 from the electrode 58. Unlike conventional electrolytic processes within the art of conductive circuit fabrication, the process disclosed herein is that of electrolytic etching, whereby the flow of material is from the substrate 2 to the fluid 42, thereby removing material from the surface of the substrate 2. As such, upon entering the fluid 42, the conductive layer of the substrate 2 will be electrically driven, by virtue of the potential difference created between the electrode 58 and the conductive layer of the substrate 2 from the electrically polarized traction feed roller 55, to give up ions to constitute a flow of current through it. In this way, the conductive layer will be gradually, but continually, depleted of its conductive layer until the entire conductive layer is removed and charge ceases to flow, at which point the system sensors (not shown) will deem the process complete. At this point, the system sensors (not shown) detect that current is no longer flowing within the conductive-layer etch unit 12, and the substrate 2 is transported out of the tank 46 by the usual action of the traction feed rollers 54 as described previously. Alternatively, only part of the conductive layer may be removed, and the electrolytic etching may be halted after a predetermined time or on detection of a predetermined condition. The current or voltage may be varied so as to control the rate of electrolytic etching.

Following this process, at a time when the system is not in use, the electrode 58 can be removed, and the conductive material that has been deposited on it by the process of electrolysis can be disposed of safely or recycled. In this way, an extremely high percentage of the material removed can be collected and reused. In the case of the system as described above the electrolytic compound is oxalic acid highly diluted with ionized water, however those skilled in the art will appreciate that the setup allows for the use of any other appropriate substance.

Referring to FIG. 3, in operation, the post-etch wash unit 14 is substantially similar to the post-development wash unit 10 described above. In a fashion similar to that described previously, the substrate 2 having been processed by the conductive-layer etch unit 12 then enters the post-etch wash unit 14, and is transported through the fluid 42. In the case of the post-etch wash unit 14, the fluid 42 contained within is a fluid suitable for the cleaning of the substrate 2, removing and neutralising any traces of etching fluid that may have remained on the substrate 2 following the operation of the conductive-layer etch unit 12. Further, the action of the cleaning fluid also removes any further remnants of the conductive layer that were intended to be removed in the conductive-layer etch unit 12. In a similar manner to that of the post-development wash unit 10, the fluid can be drained through drain plug 50, and any materials in suspension can be reclaimed for reuse.

Referring to FIG. 3, in operation, the photoresist removal unit 16 is substantially similar to the photoresist development unit 8 described above. In a fashion similar to that described previously, the substrate 2 having been processed by the post-etch wash unit 14 then enters the photoresist removal unit 16, and is transported through the fluid 42. In the case of the photoresist removal unit 16, the fluid 42 contained within is a fluid suitable for the removal of the final layer of the photoresist that is still present on the substrate 2. This fluid will act to chemically dissolve the final remaining layer of photoresist that is present on the substrate 2, after which only the conductive layer in the design of the intended circuit, as applied in the photolithography unit 6, remains on the surface of the substrate 2. This process leaves the removed photoresist layer in suspension in the fluid 42. In a similar manner to that of the post-development wash unit 10, the fluid can be drained through drain plug 50, and any materials in suspension can be reclaimed for reuse. In a similar manner to that of the photoresist development unit 8, the fluid can be drained through drain plug 50, and any materials in suspension, such as the removed photoresist, can be reclaimed for reuse.

In the embodiments described above, the fabrication process has been demonstrated in the context of discontinuous movement of the substrate 2 through the system, wherein at certain points the substrate is held in place whilst processing is completed. However, it will be appreciated that further embodiments, not included for conciseness, could be envisaged where the motion of the substrate 2 is continuous throughout the system.

FIGS. 5 to 8 demonstrate the appearance of the flexible substrate at various stages in the fabrication process described above.

Figure 5:
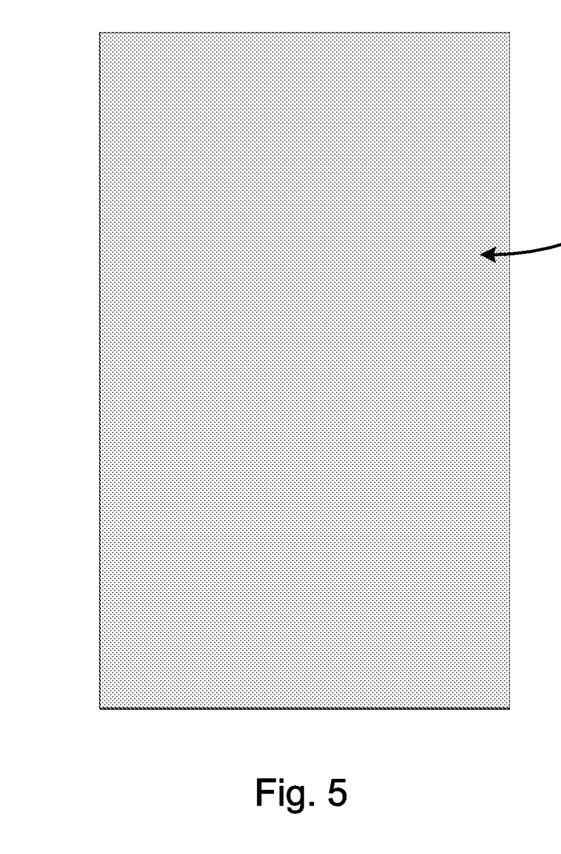
FIG. 5 illustrates a section of the substrate.

FIG. 5 illustrates a section of ITO coated PET 64 that can be used in the above embodiments. However, as is true for all of the embodiments herein, this material could be any transparent or non-transparent material with a continuous or semi-continuous conductive coating, such as described above. Similarly, the substrate can be any material that can be coated with a thin layer of conductive material, and in some cases the conductive material itself may also act as the substrate.

Figure 6:
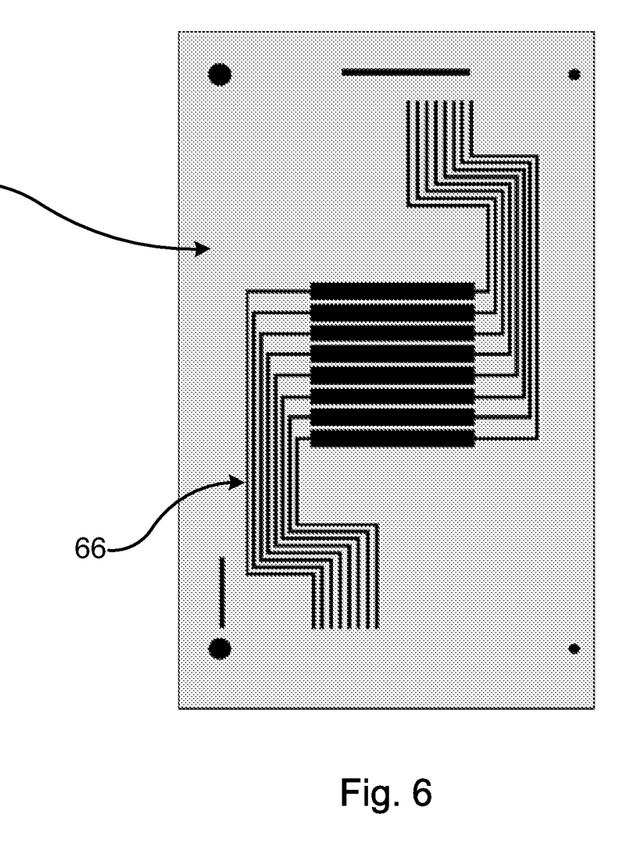
FIG. 6 illustrates a section of the substrate which has a patterned layer of material formed on the conductive side of the substrate.

FIG. 6 illustrates a section of ITO coated PET 64, as in FIG. 5, which has a patterned layer of protective material 66 formed on the conductive side of the substrate to protect select areas of the conductive layer from being removed when it is subjected to the patterning process described in earlier embodiments. This is how the substrate appears on leaving the photoresist development unit 8, and also how it appears after washing in post-development wash unit 10 before entering conductive-layer etch unit 12. Any substance that is used in the patterning process must not remove the protective material layer 66, as this would result in damage to the electronic circuit, as well as the partial or complete removal of sections that are not desired to be removed.

Figure 7:
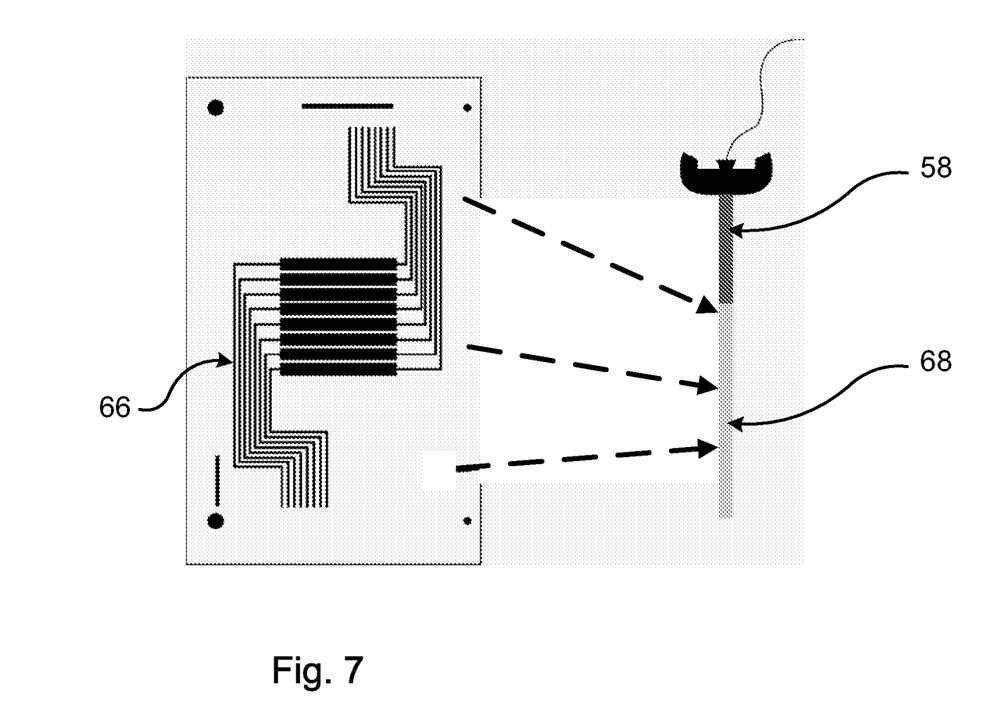
FIG. 7 illustrates the action of the electrolytic process on both the section of substrate and the electrode.

FIG. 7 illustrates a section of ITO coated PET where the ITO that is not protected has migrated (represented by dashed arrows) from the surface of the PET to the electrode 58 in the manner previously described in relation to the electrolytic action of the conductive-layer etch unit 12. This migration of ITO results in the electrode 58 being covered by a deposited layer of ITO 68. Advantageously, almost all of the ITO that is removed from the PET during this process can be reused in further processes, as will be described below.

Figure 8:
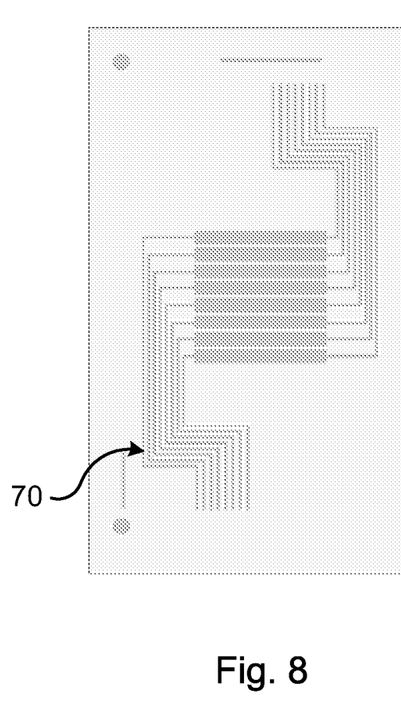
FIG. 8 illustrates a section of the substrate after the fabrication process.

FIG. 8 illustrates a section of ITO coated PET where the protective coating 66 has been removed revealing the desired pattern of conductive material 70. This is how the final substrate appears.

Figure 9:
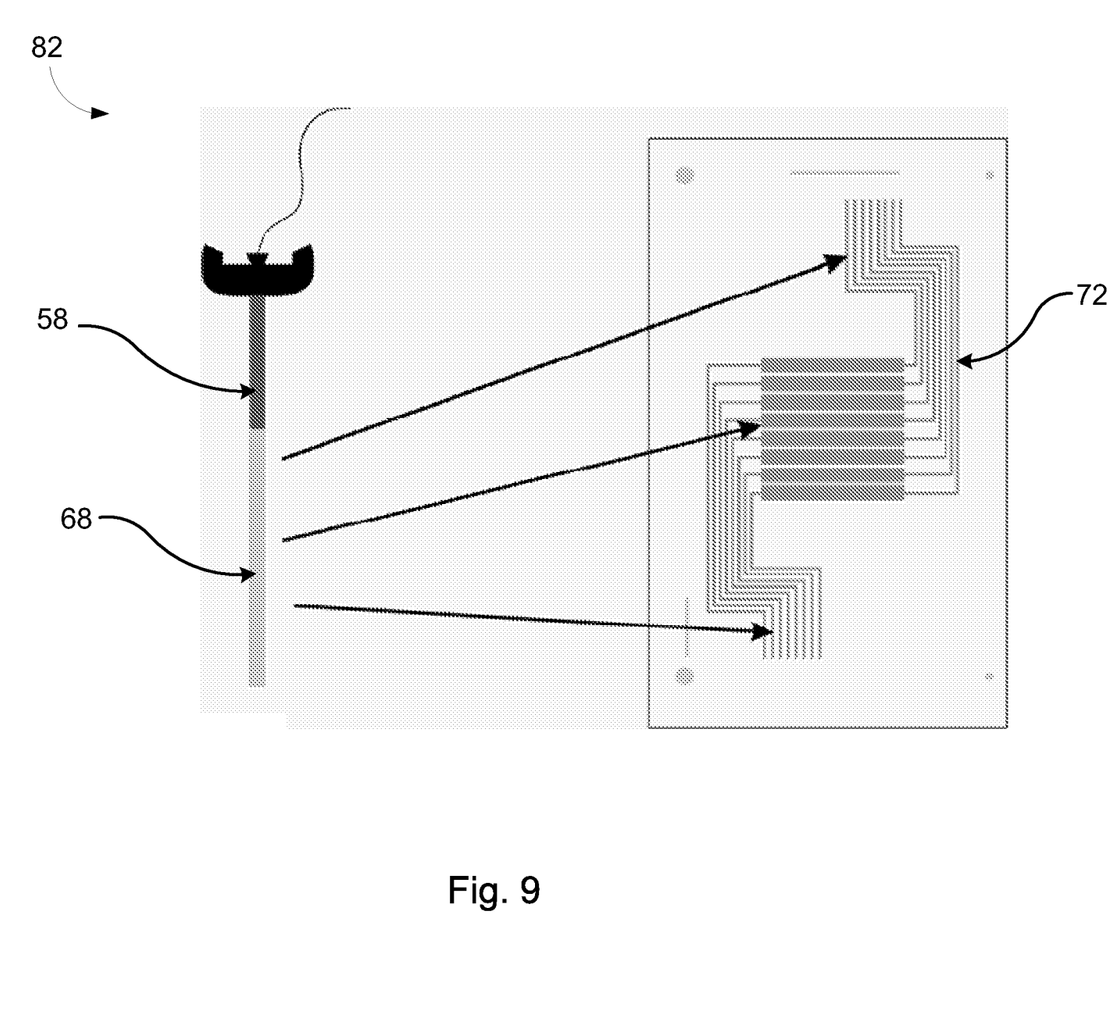
FIG. 9 illustrates a process of redeposition.

FIG. 9 illustrates a process of electroplating redeposition (82) that is an advantageous addition to the fabrication process described herein. This advantageous addition is only possible due to the distinguishing processes and embodiments described herein, which as previously stated, is unlike conventional electrolytic processes within the art of conductive circuit fabrication as the process disclosed is that of electrolytic etching, whereby the flow of material is from the substrate 2 to the fluid 42, thereby removing material from the surface of the substrate 2. As a result of this action, as previously described in relation to the conductive-layer etch unit 12, there is a significant quantity of the conductive layer of the substrate 2 deposited on the electrode 58. The setup disclosed in FIG. 9 seeks to advantageously exploit this feature.

In operation, the setup of FIG. 9 is envisaged to occur within a tank called the redeposition tank, that is substantially similar in design to the conductive-layer etch unit 12 of FIG. 4. A section of ITO coated PET is shown, where the ITO that is collected on the electrode 68 is to be deposited back onto the already patterned ITO by reversing the polarity of the electrical field as previously described in relation to conductive-layer etch unit 12. As such, the polarity of the field between the electrode 58 and the remaining ITO on the PET substrate 2, as effected by electrically polarised traction feed rollers substantially similar those number 55 in FIG. 4, will be reversed. This reversal in polarity of field will have the opposite effect of the electrolytic process described in relation to FIG. 4, namely the conductive material deposited on the electrode 68 will be driven to give up ions to constitute a reverse flow of current whereby the conductive material ends up being redeposited onto the conductive ITO that is left on the PET substrate. This results in a substantially thicker layer of conductive material 72 on the substrate 2. As the current continues to flow, redeposition will continue to occur until a state is reached that is deemed to be sufficient by the system sensors (not shown). The current or voltage may be controlled so as to control the thickness of the redeposited material. Preferably, the applied voltage or current is DC (Direct Current) and the reversal of polarities occurs between discrete steps of the deposition process.

This setup solves a number of problems, and thus represents a number of advantageous effects. Firstly, it is often in the manufacturer's interest to have a thin conductive layer on the substrate, as this is faster to remove during fabrication. However, less conductive material makes for a much less efficient conductive surface, and subsequently a less efficient electronic circuit. This redeposition of conductive material onto the already present conductive material solves this problem, as in many cases a substantial amount of the conductive material needs to be removed or disconnected from the substrate to get the pattern required, and so being able to reuse this conductive material by redeposition represents a significant advantageous increase in the conductivity, efficiency and durability of the resulting electronic substrate.

Secondly, as the conductive material constitutes the most expensive component of the substrate, the ability to recycle and redeposit it represents a significant advantageous saving in cost.

This process can be implemented with the previous embodiments of the disclosure in a number of manners. For instance, a setup as seen in FIG. 1 can be envisaged whereby following the photoresist removal unit 16 there is a redeposition tank substantially similar to the conductive-layer etch unit 12, where in operation the electrode is mechanically moved (by machinery not shown here) between the conductive-layer etch unit 12 and said redeposition tank to alternately remove and collect the conductive layer material during the etching process at conductive-layer etch unit 12, and then deposit the collected conductive layer back onto the substrate in said redeposition tank. Alternatively, a setup could be envisaged where computer systems (not described here) could be used reverse the direction of the substrate through the system, wherein an area of substrate having been through the entire fabrication process up to immersion in the photoresist removal unit 16, could then be realigned into the conductive-layer etch unit 12, which then has its electrical polarity reversed relative to its original operation, thereby constituting a redeposition of conductive material as previously described. For this system to work, it is evident that the nature of the chemicals chosen to be used in each of the tank units need to be of a type that does not in any way damage or effect the state of the substrate when the system is run in reverse, where the substrate moves backward through tanks by which it has already been processed. The person skilled will appreciate this and be able to achieve a suitable setup using known methods.

These exemplary embodiments are to be seen as merely illustrative and not limiting of the manner in which the setup of FIG. 9 could be implemented within the fabrication process as disclosed herein. It will be appreciated that further embodiments, not included for conciseness, could be envisaged.

Figures 10, 11:
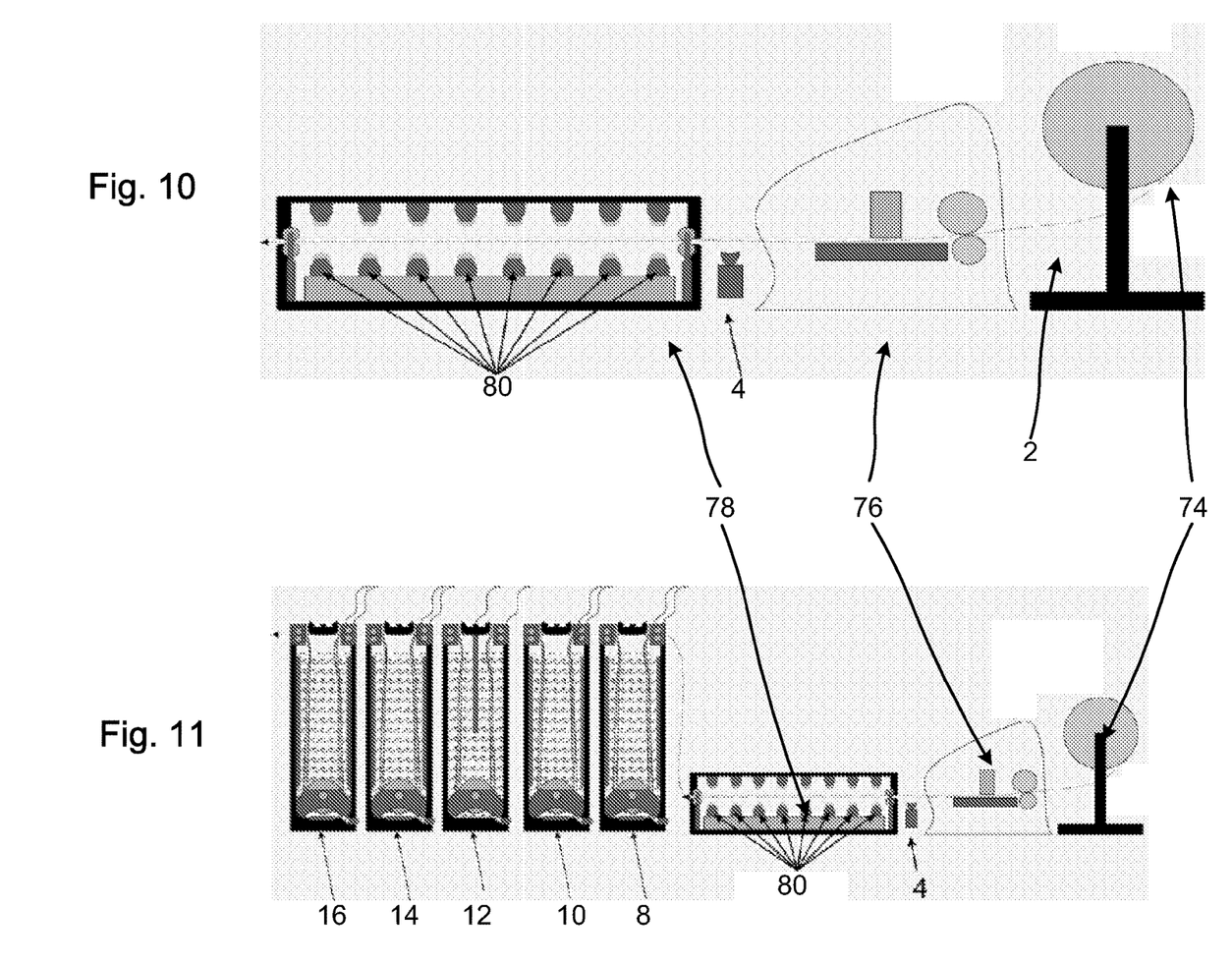
FIG. 10 illustrates alternative components to be used in the fabrication process.
FIG. 11 illustrates the alternative embodiment of the fabrication process using the components of FIG. 10.

FIG. 10 illustrates an alternative embodiment in which the laminator unit 1 and the photolithography unit 6 of all previous embodiments are replaced by alternative units, as described below. The replacement of these two units by alternative units is the only distinction over the previous embodiments, and so it can be seen that these two units can merely be combined with all previously disclosed embodiments in place of the laminator unit 1 and the photolithography unit 6. A roll of PET coated with ITO 74 is positioned in such a way such that the substrate 2 is in a location that is advantageous to the dispensing of the material. An inkjet printer 76 is supplied with the pattern that is to be made on the substrate (in a process known in the art and not described here). The optical inspection unit 4 is identical in form and function to that previously described. An Infra-Red (IR) drying unit 78, containing multiple IR sources 80, is used to fix the ink that has been dispensed by the printer (in a process known in the art and not described here). The inkjet printer 76 may be replaced by an inline silk screen printer, a flexographic printer or any other printing possesses that are able to dispense the type of material used as a protection layer for the conductive material.

FIG. 11 is an illustration of the fabrication system using the alternative components as shown in FIG. 10 and described above.

ALTERNATIVE EMBODIMENTS

The embodiments described above are illustrative of, rather than limiting to, the present invention. Alternative embodiments apparent on reading the above description may nevertheless fall within the scope of the invention.

REFERENCE NUMERALS

1 - laminator unit
2 - substrate
4 - optical inspection unit
6 - photolithography unit
8 - photoresist development unit
10 - post-development wash unit
12 - conductive-layer etch unit
14 - post-etch wash unit
16 - photoresist removal unit
18 - substrate base feed roller
19 - substrate base layer
20 - dry etch resist feed roller
21 - dry etch resist layer
22 - pressure and traction roller
24 - heated pressure roller
26 - alignment rollers
28 - U.V. light source array
30 - adjustable height rollers
32 - pattern design
34 - substrate path
36 - adjustable height roller support arm
38 - current carrying traction feed rollers
40 - substrate guide
42 - process-specific fluid
44 - electrical connectors
46 - tank (electrochemical and solvent resistive)
48 - substrate guide roller
50 - drain plug
52 - cap
54 - traction feed roller
55 - electrically polarised traction feed roller
56 - aeration system
57 - traction feed rollers
58 - electrode
60 - electrical connector
62 - electrical connector
64 - ITO coated PET
66 - protective material layer
68 - deposited layer of ITO
70 - desired pattern of conductive material
72 - thick layer of redeposited conductive material
74 - substrate roll
76 - inkjet printer
78 - IR drying unit
80 - IR sources
82 - electroplating redeposition

The invention claimed is:

1. A method of electrolytic etching and deposition, comprising:
    a. introducing a continuous section of substrate into an electrolyte within a container, wherein the substrate is initially patterned and includes a conductive layer comprising protected areas defined by having a patterned layer of protective material formed thereon and unprotected areas defined by being without a patterned layer of protective material formed thereon;
    b. applying a voltage between a first electrode, in electrical contact with the electrolyte, and a second electrode, physically separated from the first electrode and in electrical contact with the substrate, and thereby removing the unprotected areas of the conductive layer of the substrate by electrolytic etching;
    c. removing the patterned layer of protective material to change the protected areas into further unprotected areas; and
    d. at a subsequent time, reversing the polarities of the first electrode, in electrical contact with the electrolyte, and the second electrode, in electrical contact with the substrate, and thereby increasing the thickness of the further unprotected areas of the conductive layer of the substrate by electrolytic deposition.

2. The method of claim 1, wherein the second electrode is in electrical contact with the substrate via means for introducing the continuous section of substrate through the electrolyte.

3. The method of claim 2, wherein the means for introducing the continuous section of substrate through the electrolyte comprises a feed roller.

4. The method of claim 1, wherein the first electrode is removable from the container.

5. The method of claim 4, further comprising removing the first electrode from the container.

6. The method of claim 1, wherein the container includes a drain for draining the electrolyte.

7. The method of claim 6, further comprising draining at least some of the electrolyte using the drain.

8. The method of claim 1, wherein the container includes a guide for guiding the continuous section of the substrate.

9. The method of claim 8, further comprising guiding the continuous section of the substrate through the container using the guide.

10. The method of claim 1, further comprising one or more of: means for storing and dispensing the substrate, means for laminating the substrate, means for printing the substrate, means for optical inspection of the substrate, means for photolithography of the substrate, means for drying the substrate, means for developing the substrate, and means for washing the substrate.

11. The method of claim 1, wherein at least some of the material that is removed from the substrate during the step of electrolytic etching is re-deposited onto the conductive layer of the substrate during the step of increasing the thickness of the conductive layer of the substrate by electrolytic deposition.

12. The method of claim 11, wherein the at least some of the material that is removed from the substrate during the step of electrolytic etching was deposited onto the first electrode, and is re-deposited onto the conductive layer from the first electrode.

* * * * *